United States Patent
Bian (10) Patent No.: US 10,135,370 B2
(45) Date of Patent: Nov. 20, 2018

(54) INTERFACE CIRCUIT AND ELECTRICAL APPLIANCE SYSTEM COMPRISING THE SAME

(71) Applicant: Zhongshan Broad-Ocean Motor Co., Ltd., Zhongshan (CN)

(72) Inventor: Wenqing Bian, Zhongshan (CN)

(73) Assignee: ZHONGSHAN BROAD-OCEAN MOTOR CO., LTD., Zhongshan (CN)

( * ) Notice: Subject to any disclaimer, the term of this patent is extended or adjusted under 35 U.S.C. 154(b) by 0 days.

(21) Appl. No.: 15/599,444

(22) Filed: May 18, 2017

(65) Prior Publication Data

US 2017/0257045 A1    Sep. 7, 2017

Related U.S. Application Data

(63) Continuation-in-part of application No. PCT/CN2015/077457, filed on Apr. 24, 2015.

(30) Foreign Application Priority Data

Dec. 24, 2014   (CN) .......................... 2014 1 0818673

(51) Int. Cl.
| | |
|---|---|
| *G05B 11/28* | (2006.01) |
| *H02P 7/06* | (2006.01) |
| *H02P 27/08* | (2006.01) |
| *H02P 6/26* | (2016.01) |
| *H02P 6/06* | (2006.01) |

(Continued)

(52) U.S. Cl.
CPC .............. *H02P 7/06* (2013.01); *H02P 6/06* (2013.01); *H02P 6/12* (2013.01); *H02P 6/16* (2013.01);

(Continued)

(58) Field of Classification Search
CPC ... G05B 11/28; H02P 7/29; H02P 6/14; H02P 6/08; H02P 6/182

(Continued)

(56) References Cited

U.S. PATENT DOCUMENTS 7,795,827 B2 *   9/2010   Jeung ..................... H02P 6/085
                                                                235/454
7,812,556 B2 *  10/2010   Jeung ..................... H02P 6/085
                                                                235/454

(Continued)

FOREIGN PATENT DOCUMENTS

CN      2007-306752 A    11/2007
CN       200990578 Y     12/2007

(Continued)

*Primary Examiner* — Rina Duda
(74) *Attorney, Agent, or Firm* — Matthias Scholl, PC; Matthias Scholl (57) ABSTRACT

An interface circuit, including: a micro control unit (MCU), an isolated power supply, and a signal isolating circuit. The MCU, the isolated power supply, and the signal isolating circuit are integrated on a circuit board. The output end of the isolated power supply supplies power for circuits. The input end of the isolated power supply is connected to an external input power supply. The A/D conversion input port of the MCU is connected to the analog voltage signals. The MCU is configured to convert the analog voltage signals into pulse width modulation (PWM) signals or variable frequency signals with certain duty cycles, and output the PWM signals or the variable frequency signals to the input end of the signal isolating circuit. The signal isolating circuit is configured to output the PWM signals or the variable frequency signals with certain duty cycles.

13 Claims, 7 Drawing Sheets

(51) Int. Cl.
*H02P 6/12* (2006.01)
*H02P 6/16* (2016.01)
*H02P 7/29* (2016.01)
*H03K 7/08* (2006.01)

(52) U.S. Cl.
CPC .................. *H02P 6/26* (2016.02); *H02P 7/29* (2013.01); *H02P 27/08* (2013.01); *H03K 7/08* (2013.01)

(58) Field of Classification Search
USPC ..................................... 318/400.01, 599, 811
See application file for complete search history.

(56) References Cited

U.S. PATENT DOCUMENTS

| 8,129,999 | B2* | 3/2012 | Szuba | G01R 31/1227 |
|---|---|---|---|---|
| | | | | 324/426 |
| 8,610,385 | B2 | 12/2013 | Sakaguchi | |
| 2010/0052587 | A1 | 3/2010 | Bonvin et al. | |
| 2011/0234140 | A1 | 9/2011 | Kuroda | |
| 2011/0260671 | A1* | 10/2011 | Jeung | H02P 6/08 |
| | | | | 318/701 |
| 2012/0142201 | A1* | 6/2012 | Zhao | H02P 29/00 |
| | | | | 439/78 |
| 2013/0288590 | A1* | 10/2013 | Hu | F24F 11/0001 |
| | | | | 454/256 |

FOREIGN PATENT DOCUMENTS

| CN | 201531444 U | 7/2010 |
|---|---|---|
| CN | 201590795 U | 9/2010 |
| CN | 201663576 U | 12/2010 |
| CN | 102638209 A | 8/2012 |
| CN | 102801384 A | 11/2012 |
| CN | 103199496 A | 7/2013 |
| CN | 203554199 U | 4/2014 |

* cited by examiner

INTERFACE CIRCUIT AND ELECTRICAL APPLIANCE SYSTEM COMPRISING THE SAME

CROSS-REFERENCE TO RELATED APPLICATIONS

This application is a continuation-in-part of International Patent Application No. PCT/CN2015/077457 with an international filing date of Apr. 24, 2015, designating the United States, and further claims foreign priority benefits to Chinese Patent Application No. 201410818673.8 filed Dec. 24, 2014. The contents of all of the aforementioned applications, including any intervening amendments thereto, are incorporated herein by reference.

BACKGROUND OF THE INVENTION

Field of the Invention

The invention relates to an interface circuit for speed regulation in an isolated manner and an electrical appliance system comprising the same.

Description of the Related Art

Figure 1:
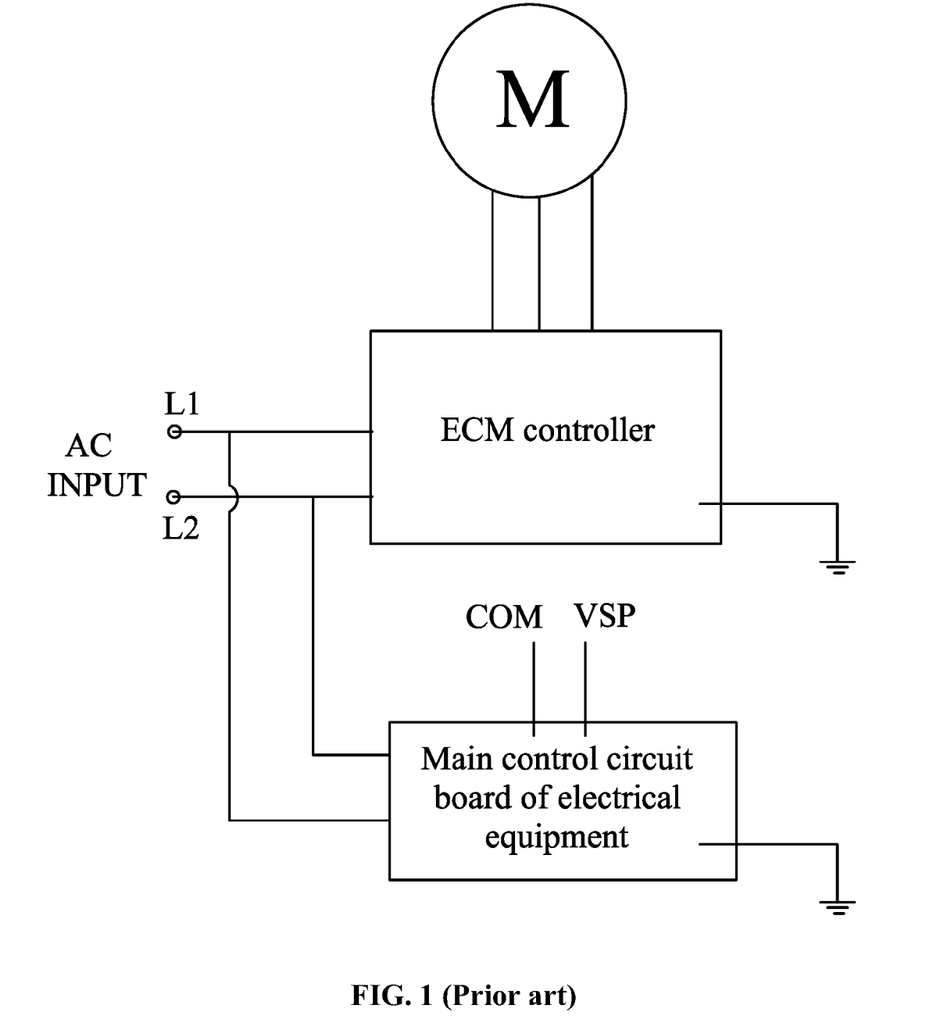
FIG. 1 is a connection diagram of an electrical appliance system and an electronically commutated motor in the prior art.

Electrical appliance systems such as central air conditioning systems, ventilation systems, and washing machine systems include a plurality of electronically commutated motors (ECM). Conventionally, the speed of the ECM is regulated using between 0 and 10 V analog voltage. The ECM controller and the speed controller are not common-grounded, as shown in FIG. 1, as a result, the ECM is unable to directly read the voltage. To solve this, signal isolation transmission using linear optocouplers and serial communication using specific communication protocols have been employed, however, both ways are expensive and complex in use.

SUMMARY OF THE INVENTION

In view of the above-described problems, it is one objective of the invention to provide an interface circuit for speed regulation in an isolated manner. The interface circuit comprises a low-cost micro control unit (MCU) and an isolated power supply. The MCU is configured to read the analog voltage signal and output pulse width modulation (PWM) signals or variable frequency signals via a pin on the MCU, then the signals are transmitted to an Electronically Commutated Motor (ECM) via a low-cost signal isolating circuit (digital optocoupler), thus decreasing the cost. In addition, the signals converted by the MCU features high accuracy and reliability.

It is another objective of the invention to provide an electrical appliance system. The electrical appliance system comprises an interface circuit for speed regulation in an isolated manner which is employed to regulate the speed of the ECM. Speed regulation using between 0 and 10 V analog voltage is applicable in the electrical appliance system. Signal conversion in the system is accurate and reliable.

To achieve the above objective, in accordance with one embodiment of the invention, there is provided an interface circuit for speed regulation in an isolated manner, comprising a micro control unit (MCU), an isolated power supply, and a signal isolating circuit. The MCU, the isolated power supply, and the signal isolating circuit are integrated on a circuit board. An output end of the isolated power supply supplies power for circuits. An input end of the isolated power supply is connected to an external input power supply. An A/D conversion input port of the MCU is connected to analog voltage signals. The MCU is configured to convert the analog voltage signals into pulse width modulation (PWM) signals or variable frequency signals with certain duty cycles, and output the PWM signals or the variable frequency signals to an input end of the signal isolating circuit. The signal isolating circuit is configured to output the PWM signals or the variable frequency signals.

In a class of this embodiment, the circuit board comprises a COM port and an input port of the analog voltage signals. The COM port is a common port. The analog voltage signals are in a range between 0 and 10 V.

In a class of this embodiment, the circuit board comprises a PWM signal output port and an input port of the isolated power supply.

In a class of this embodiment, the MCU comprises a signal comparison table with regard to the analog voltage signals and corresponding PWM signals having duty cycles. The MCU generates the PMW signals with certain duty cycles according to the analog voltage signals passing through the A/D conversion input port by referring to the signal comparison table. The MCU outputs the PMW signals with certain duty cycles to the signal isolating circuit.

In a class of this embodiment, when in use, the analog voltage signals are input to the MCU, and the MCU calculates the PWM signals with certain duty cycles according to a functional relationship $F=V/K*100\%$, and outputs the PWM signals to the signal isolating circuit. K is a proportional coefficient, F is a duty cycle of an output signal, and V is a sampled A/D input voltage.

An electrical appliance system, comprises at least one Electronically Commutated Motor (ECM) and a main control circuit board of electrical equipment. The ECM and the main control circuit board are connected to an AC input power supply. The ECM and the main control circuit board are connected to independent grounding wires. The main control circuit board is configured to output between 0 and 10 V analog voltage signals to control speed of the ECM. The ECM is connected to the main control circuit board via an interface circuit for speed regulation in an isolated manner. The interface circuit for speed regulation in an isolated manner comprises a MCU, an isolated power supply, and a signal isolating circuit. The MCU, the isolated power supply, and the signal isolating circuit are integrated on a circuit board. An output end of the isolated power supply supplies power for circuits. An input end of the isolated power supply is connected to an output end of a power supply of the ECM. An A/D conversion input port of the MCU is connected to analog voltage signals. The MCU is configured to convert the analog voltage signals to PWM signals or variable frequency signals with certain duty cycles, and output the PWM signals or the variable frequency signals to an input end of the signal isolating circuit. The signal isolating circuit is configured to output the PWM signals or the variable frequency signals to a motor controller of the ECM.

In a class of this embodiment, the ECM comprises the motor controller and a motor body. The motor body comprises a stator assembly, a rotor assembly, and a shell assembly. The stator assembly and the rotor assembly are disposed inside the shell assembly. The stator assembly comprises a stator core and a coil winding wound around the stator core. The rotor assembly comprises a rotor core and a permanent magnet sheathed in the rotor core. The motor controller comprises a control circuit board. The control circuit board is provided with a microprocessor, an inverter circuit, a detecting unit of operation parameter of the motor, and a power circuit. An input end of the power circuit is connected to the AC input power supply. Output ends of the power circuit supply power for circuits. The detecting unit of the operation parameter of the motor transmits motor operation data to the microprocessor. An output end of the microprocessor is connected to an input end of the inverter circuit. An output end of the inverter circuit is connected to the coil winding wound around the stator core. The PMW signals or the variable frequency signals output from the signal isolating circuit are directly transmitted to an input end of the microprocessor. One output end of the power circuit is connected to the input end of the isolated power supply.

In a class of this embodiment, the circuit board comprises a COM port and an input port of the analog voltage signals. The COM port is a common port. The circuit board further comprises a PWM signal output port and an input port of the isolated power supply. The analog voltage signals are in a range between 0 and 10 V.

In a class of this embodiment, the main control circuit board of electrical equipment is a main control circuit board of air conditioning equipment, a main control circuit board of stove, a main control circuit board of washing machine, or a main control circuit board of heating, ventilation and air conditioning system.

In a class of this embodiment, the signal isolating circuit is an optically coupled isolator.

In a class of this embodiment, the MCU on the circuit board of the interface circuit comprises a signal comparison table with regard to the analog voltage signals and corresponding PWM signals having duty cycles. The MCU generates the PMW signals with certain duty cycles according to the analog voltage signals passing through the A/D conversion input port by referring to the signal comparison table. The MCU outputs the PMW signals with certain duty cycles to the signal isolating circuit.

In a class of this embodiment, when in use, the analog voltage signals are input to the MCU on the circuit board of the interface circuit, and the MCU calculates the PWM signals with certain duty cycles according to a functional relationship F=V/K*100%, and outputs the PWM signals to the signal isolating circuit. K is a proportional coefficient, F is a duty cycle of an output signal, and V is a sampled A/D input voltage.

In a class of this embodiment, the isolated power supply and the main control circuit board are common-grounded.

Advantages of the interface circuit and the electrical appliance system according to embodiments of the invention are summarized as follows:

1. The interface circuit comprises a low-cost MCU and an isolated power supply. The MCU is configured to read the value of the analog voltage signal and output PWM signals or variable frequency signals via a pin on the MCU, then the signals are transmitted to the ECM via a low-cost signal isolating circuit (digital optocoupler), thus decreasing the cost. The circuit structure is compact. In addition, the signals converted by the MCU features high accuracy and reliability.
2. The circuit board of the interface circuit comprises a COM port and an input port of the analog voltage signals. The COM port is a common port. The analog voltage signals are in a range between 0 and 10 V. The circuit board further comprises a PWM signal output port and an input port of the isolated power supply. The arrangement is simple, and the connection is convenient.
3. The MCU comprises a signal comparison table with regard to the analog voltage signals and corresponding PWM signals having duty cycles. The MCU generates the PMW signals with certain duty cycles according to the analog voltage signals passing through the A/D conversion input port by referring to the signal comparison table. The MCU outputs the PMW signals with certain duty cycles to the signal isolating circuit. Or, the analog voltage signals are input to the MCU on the circuit board of the interface circuit, and the MCU calculates the PWM signals with certain duty cycles according to a functional relationship F=V/K*100%, and outputs the PWM signals to the signal isolating circuit. K is a proportional coefficient, F is a duty cycle of an output signal, and V is a sampled A/D input voltage. The calculation is simple, and occupies less MCU resources, thus a low-cost single-chip MCU is applicable.
4. The electrical appliance system comprises a main control circuit board. The main control circuit board is configured to output between 0 and 10 V analog voltage signals to control speed of the ECM. The ECM is connected to the main control circuit board via an interface circuit for speed regulation in an isolated manner. The cost of the interface circuit is low, and the arrangement is simple. In addition, the signals converted by the MCU features high accuracy and reliability.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing an interface circuit for speed regulation in an isolated manner and an electrical appliance system comprising the same are described below.

Figure 2:
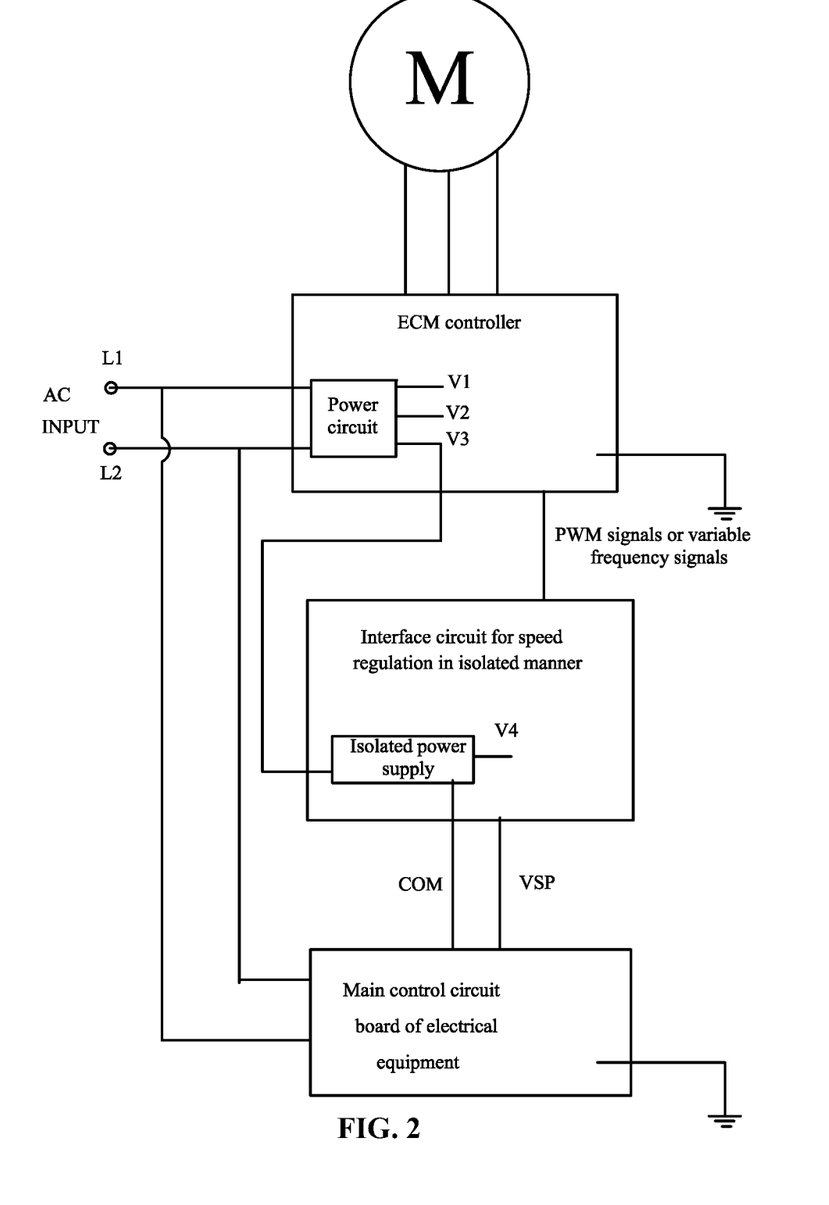
FIG. 2 is a circuit diagram of an interface circuit for speed regulation in an isolated manner and an electrical appliance system in accordance with one embodiment of the invention.
Figure 3:
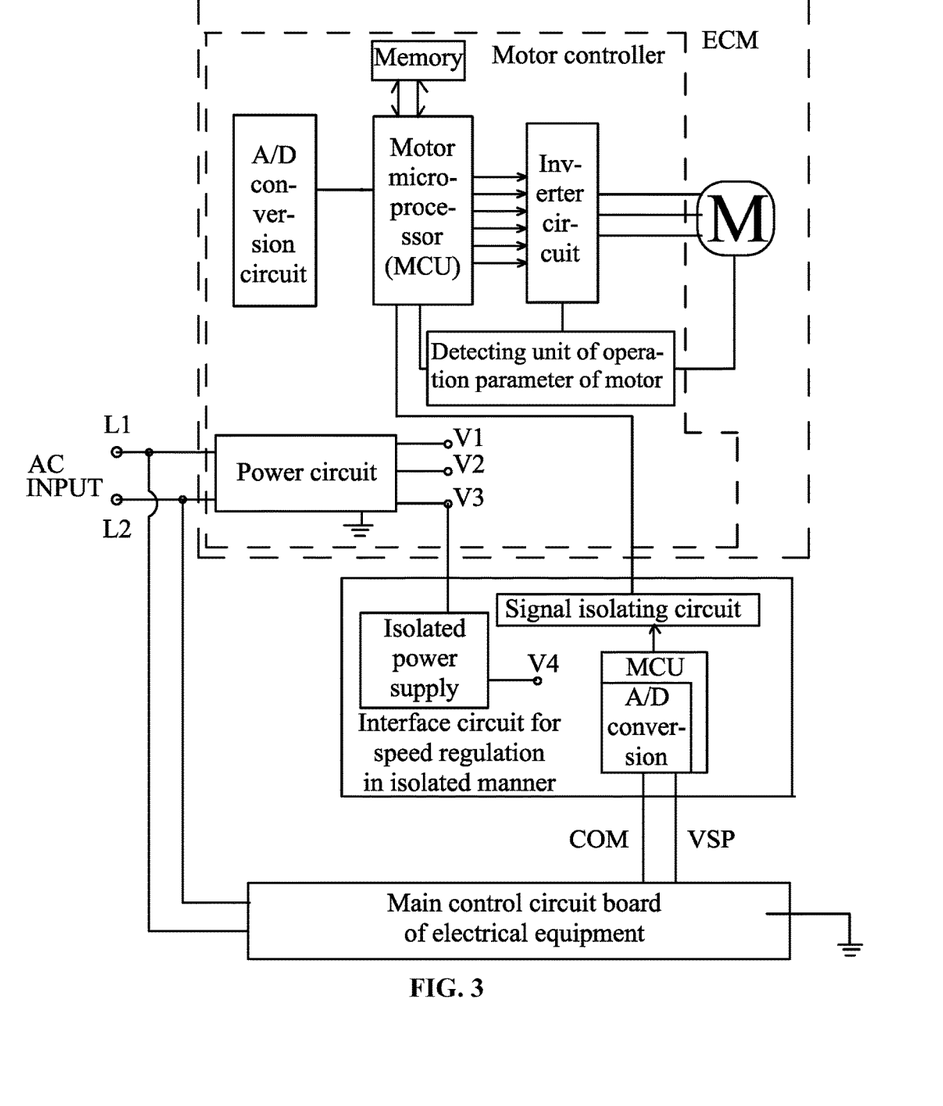
FIG. 3 is a diagram showing specific implementation scheme of FIG. 2.
Figure 4:
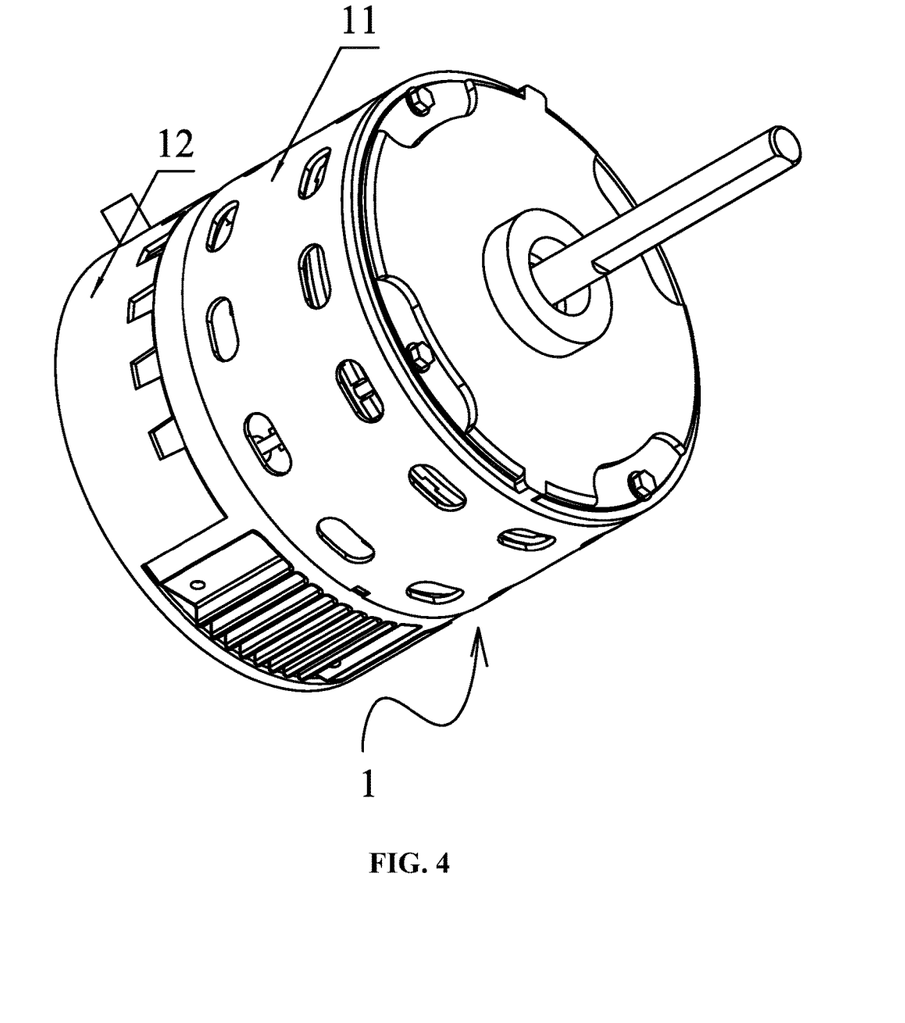
FIG. 4 is a stereogram of an electronically commutated motor in accordance with one embodiment of the invention.
Figure 5:
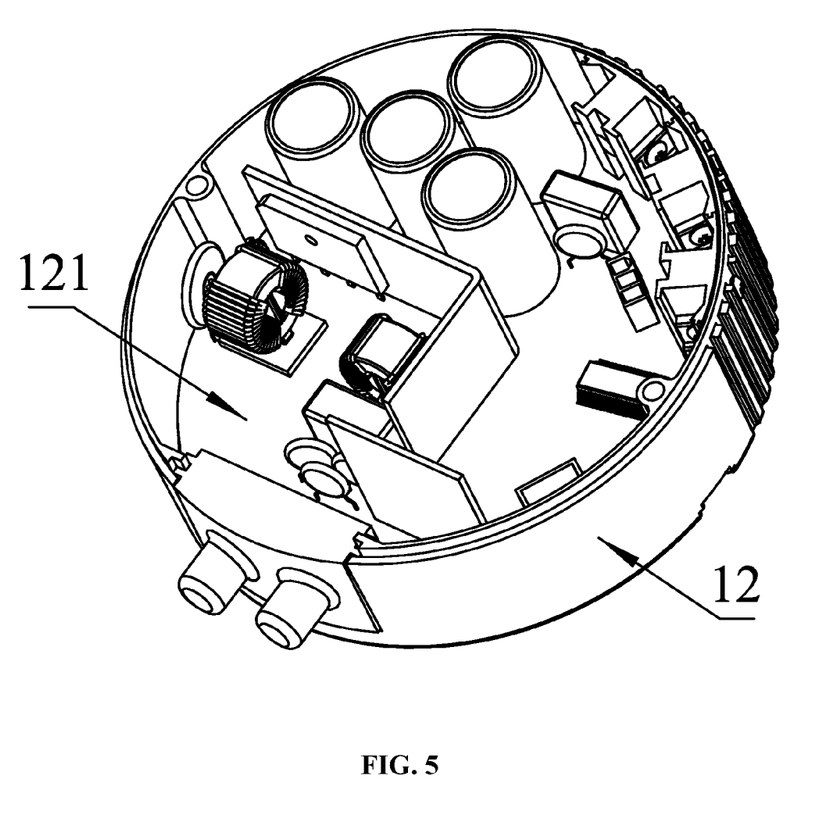
FIG. 5 is a stereogram of a motor controller of an electronically commutated motor in accordance with one embodiment of the invention.
Figure 6:
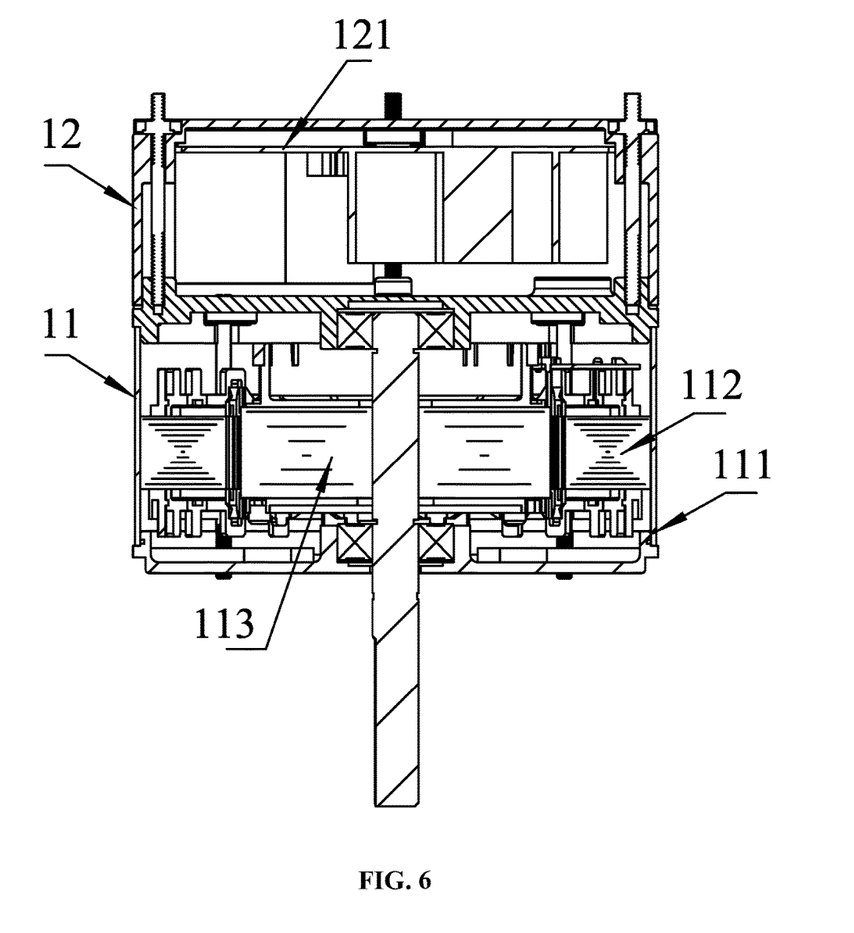
FIG. 6 is a cross-sectional view of an electronically commutated motor in accordance with one embodiment of the invention.
Figure 7:
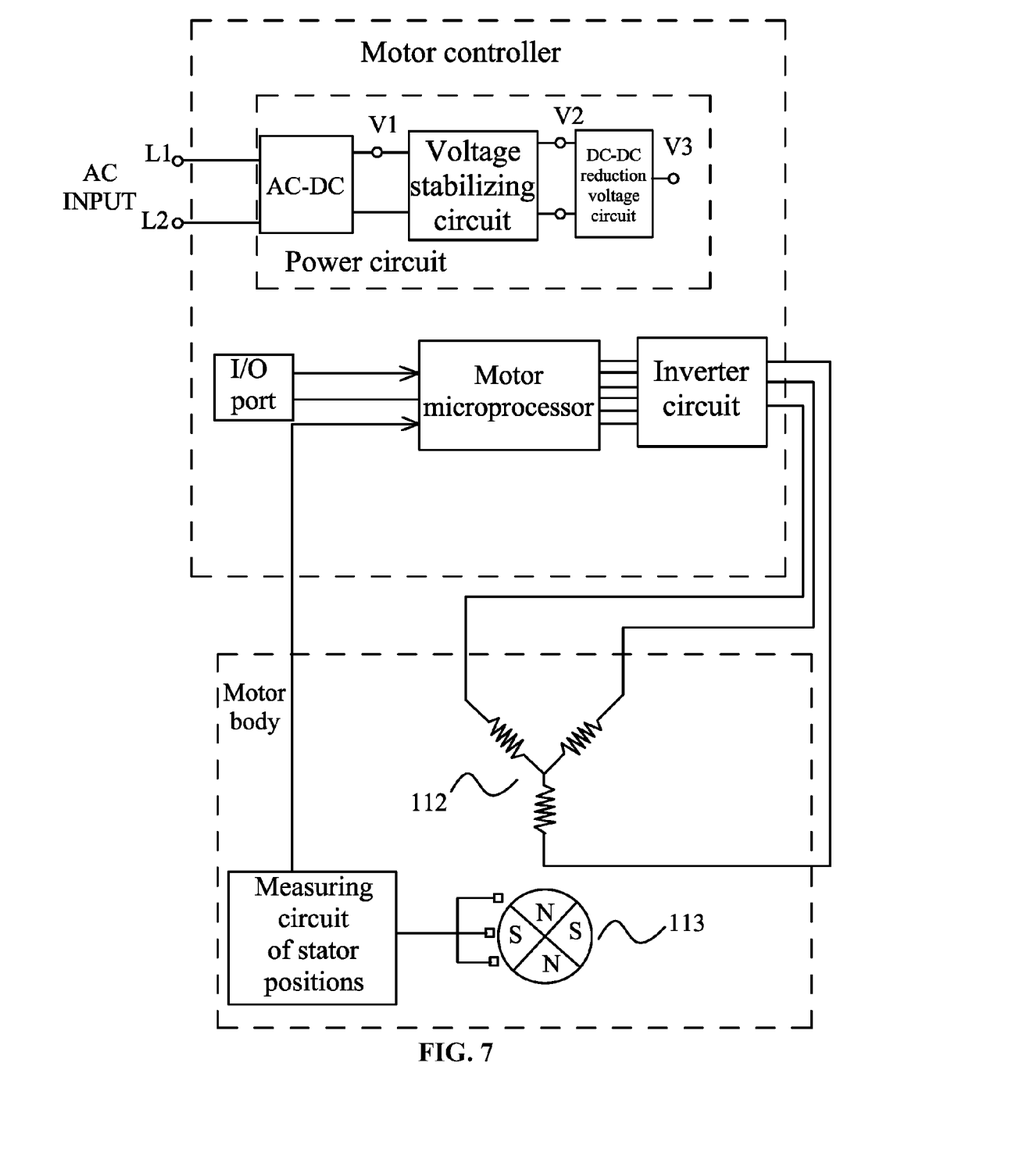
FIG. 7 is a circuit diagram an electronically commutated motor in accordance with one embodiment of the invention.

As shown in FIGS. 2-3, an electrical appliance system comprises at least one Electronically Commutated Motor (ECM) and a main control circuit board of electrical equipment. The ECM and the main control circuit board are connected to an AC input power supply. The ECM and the main control circuit board are connected to independent grounding wires. The main control circuit board is configured to output between 0 and 10 V analog voltage signals to control speed of the ECM. The ECM is connected to the main control circuit board via an interface circuit for speed regulation in an isolated manner. The interface circuit for speed regulation in an isolated manner comprises a MCU, an isolated power supply, and a signal isolating circuit. The MCU, the isolated power supply, and the signal isolating circuit are integrated on a circuit board. An output end of the isolated power supply supplies power for circuits. An input end of the isolated power supply is connected to an output end of a power supply of the ECM. An A/D conversion input port of the MCU is connected to analog voltage signals. The MCU is configured to convert the analog voltage signals to PWM signals or variable frequency signals with certain duty cycles, and output the PWM signals or the variable frequency signals to an input end of the signal isolating circuit. The signal isolating circuit is configured to output the PWM signals or the variable frequency signals to a motor controller of the ECM.

As shown in FIGS. 3-7, the ECM 1 comprises the motor controller 12 and a motor body 11. The motor body 11 comprises a stator assembly 112, a rotor assembly 113, and a shell assembly 111. The stator assembly 112 and the rotor assembly 113 are disposed inside the shell assembly 111. The stator assembly 112 comprises a stator core and a coil winding wound around the stator core. The rotor assembly 113 comprises a rotor core and a permanent magnet sheathed in the rotor core. The motor controller 12 comprises a control circuit board 121. The control circuit board 121 is provided with a microprocessor, an inverter circuit, a detecting unit of operation parameter of the motor, and a power circuit. An input end of the power circuit is connected to the AC input power supply. Output ends of the power circuit supply power for circuits. The detecting unit of the operation parameter of the motor transmits motor operation data to the microprocessor. An output end of the microprocessor is connected to an input end of the inverter circuit. An output end of the inverter circuit is connected to the coil winding wound around the stator core. The PMW signals or the variable frequency signals output from the signal isolating circuit are directly transmitted to an input end of the microprocessor. One output end of the power circuit is connected to the input end of the isolated power supply. The detecting unit of the operation parameter of the motor comprises a measuring circuit of stator positions in FIG. 7. The power circuit outputs three types of supply voltages: DC bus voltage V1, DC voltage V2 of inverter circuit, and DC voltage V3 of the microprocessor of the motor. The DC voltage V3 is output to the input end of the isolated power supply. The circuit structure belongs to the prior art, and no need to illustrate herein. The circuit board of the interface circuit comprises a COM port and an input port of the analog voltage signals. The COM port is a common port. The circuit board further comprises a PWM signal output port and an input port of the isolated power supply. The analog voltage signals are in a range between 0 and 10 V. The isolated power supply and the main control circuit board are common-grounded via the COM port.

The main control circuit board of electrical equipment is a main control circuit board of air conditioning equipment, a main control circuit board of stove, a main control circuit board of washing machine, or a main control circuit board of heating, ventilation and air conditioning system. The signal isolating circuit is an optically coupled isolator.

The MCU on the circuit board of the interface circuit comprises a signal comparison table (as shown in Table 1) used for comparing the analog voltage signals with the PWM signals featuring different duty cycles. The MCU generates the PMW signals with certain duty cycles according to the analog voltage signals passing through the A/D conversion input port by referring to the signal comparison table. The MCU outputs the PMW signals with certain duty cycles to the signal isolating circuit.

TABLE 1

| Analog voltage signal | Duty cycle of PWM signal |
|---|---|
| 0.1 V | 1% |
| 0.2 | 2% |
| ... | ... |
| 1.1 V | 11% |
| 1.5 V | 15% |
| ... | ... |
| ... | ... |
| 4.5 V | 45% |
| 4.6 V | 46% |
| ... | ... |
| 9.9 V | 99% |
| 10 V | 100% |

The analog voltage signals are input to the MCU on the circuit board of the interface circuit, and the MCU calculates the PWM signals with certain duty cycles according to a functional relationship $F=V/K*100\%$, and outputs the PWM signals to the signal isolating circuit. K is a proportional coefficient, and K=10 here, F is a duty cycle of an output signal, and V is a sampled A/D input voltage.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. An interface circuit, comprising:
    a micro control unit (MCU);
    an isolated power supply; and
    a signal isolating circuit;
    wherein
        the MCU, the isolated power supply, and the signal isolating circuit are integrated on a circuit board;
        an output end of the isolated power supply supplies power for circuits; an input end of the isolated power supply is connected to an external input power supply;
        an A/D conversion input port of the MCU is adapted to receive analog voltage signals;
        the MCU is configured to convert the analog voltage signals into pulse width modulation (PWM) signals having duty cycles, and output the PWM signals having the duty cycles to an input end of the signal isolating circuit;
        the MCU is configured to generate the PMW signals having the duty cycles based on a functional relationship $F=V/K*100\%$ or a signal comparison table comprising the analog voltage signals and corresponding PWM signals having the duty cycles, wherein K represents a proportional coefficient, F represents the duty cycles, and V represents the analog voltage signals; and
        the signal isolating circuit is configured to output the PWM signals having the duty cycles to a motor controller.

2. The interface circuit of claim 1, wherein the circuit board comprises a COM port and an input port of the analog voltage signals; the COM port is a common port; and the analog voltage signals are in a range between 0 and 10 V.

3. The interface circuit of claim 1, wherein the circuit board comprises a PWM signal output port and an input port of the isolated power supply.

4. The interface circuit of claim 2, wherein the circuit board comprises a PWM signal output port and an input port of the isolated power supply.

5. An electrical appliance system, comprising:
- at least one Electronically Commutated Motor (ECM); and
- a main control circuit board of electrical equipment;

wherein
- the ECM and the main control circuit board are connected to an AC input power supply; the ECM and the main control circuit board are connected to independent grounding wires; the main control circuit board is configured to output between 0 and 10 V analog voltage signals to control speed of the ECM; the ECM is connected to the main control circuit board via an interface circuit;
- the interface circuit comprises a micro control unit (MCU), an isolated power supply, and a signal isolating circuit; the MCU, the isolated power supply, and the signal isolating circuit are integrated on a circuit board; an output end of the isolated power supply supplies power for circuits; an input end of the isolated power supply is connected to an output end of a power supply of the ECM;
- an A/D conversion input port of the MCU is adapted to receive analog voltage signals; the MCU is configured to convert the analog voltage signals into pulse width modulation (PWM) signals having duty cycles, and output the PWM signals having the duty cycles to an input end of the signal isolating circuit; and
- the signal isolating circuit is configured to output the PWM signals having the duty cycles to a motor controller of the ECM; and
- the MCU is configured to generate the PMW signals having the duty cycles based on a functional relationship F=V/K*100% or a signal comparison table comprising the analog voltage signals and corresponding PWM signals having the duty cycles, wherein K represents a proportional coefficient, F represents the duty cycles, and V represents the analog voltage signals.

6. The electrical appliance system of claim 5, wherein the ECM comprises the motor controller and a motor body; the motor body comprises a stator assembly, a rotor assembly, and a shell assembly; the stator assembly and the rotor assembly are disposed inside the shell assembly; the stator assembly comprises a stator core and a coil winding wound around the stator core; the rotor assembly comprises a rotor core and a permanent magnet sheathed in the rotor core; the motor controller comprises a control circuit board; the control circuit board is provided with a microprocessor, an inverter circuit, a detecting unit of operation parameter of the motor, and a power circuit; an input end of the power circuit is connected to the AC input power supply; output ends of the power circuit supply power for the circuits; the detecting unit of the operation parameter of the motor transmits motor operation data to the microprocessor; an output end of the microprocessor is connected to an input end of the inverter circuit; an output end of the inverter circuit is connected to the coil winding wound around the stator core; the PMW signals having the duty cycles output from the signal isolating circuit are directly transmitted to an input end of the microprocessor; and one output end of the power circuit is connected to the input end of the isolated power supply.

7. The electrical appliance system of claim 5, wherein the circuit board comprises a COM port and an input port of the analog voltage signals; the COM port is a common port; the circuit board further comprises a PWM signal output port and an input port of the isolated power supply; and the analog voltage signals are in a range between 0 and 10 V.

8. The electrical appliance system of claim 6, wherein the circuit board comprises a COM port and an input port of the analog voltage signals; the COM port is a common port; the circuit board further comprises a PWM signal output port and an input port of the isolated power supply; and the analog voltage signals are in a range between 0 and 10 V.

9. The electrical appliance system of claim 5, the main control circuit board of electrical equipment is a main control circuit board of air conditioning equipment, a main control circuit board of stove, a main control circuit board of washing machine, or a main control circuit board of heating, ventilation and air conditioning system.

10. The electrical appliance system of claim 6, the main control circuit board of electrical equipment is a main control circuit board of air conditioning equipment, a main control circuit board of stove, a main control circuit board of washing machine, or a main control circuit board of heating, ventilation and air conditioning system.

11. The electrical appliance system of claim 7, wherein the signal isolating circuit is an optically coupled isolator.

12. The electrical appliance system of claim 8, wherein the signal isolating circuit is an optically coupled isolator.

13. The electrical appliance system of claim 5, wherein the isolated power supply and the main control circuit board are common-grounded.

* * * * *